United States Patent

Suarez-Solis

(10) Patent No.: US 6,422,877 B1
(45) Date of Patent: Jul. 23, 2002

(54) APPARATUS FOR COUPLING POWER TO AN ELECTRONICS MODULE

(75) Inventor: Mario Suarez-Solis, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/679,972

(22) Filed: Oct. 5, 2000

(51) Int. Cl.⁷ .............................................. H01R 12/00
(52) U.S. Cl. ....................................................... 439/64
(58) Field of Search .......................... 439/64, 131, 630, 439/152, 485; 361/689, 699, 761, 386, 395; 174/16.3, 252

(56) References Cited

U.S. PATENT DOCUMENTS

| | | | | |
|---|---|---|---|---|
| 2,731,609 A | * | 1/1956 | Sobel, III | 439/74 |
| 3,576,515 A | * | 4/1971 | Frantz | 439/267 |
| 4,068,910 A | * | 1/1978 | Brown | |
| 4,214,292 A | * | 7/1980 | Johnson | 361/386 |
| 4,272,143 A | * | 6/1981 | Weiss | 439/259 |
| 4,542,341 A | * | 9/1985 | Santomango et al. | 324/760 |
| 4,546,407 A | * | 10/1985 | Benemati | 361/386 |
| 4,808,983 A | * | 2/1989 | Benjamin | 340/719 |
| 5,260,850 A | * | 11/1993 | Sherwood et al. | 361/689 |
| 5,434,752 A | * | 7/1995 | Huth et al. | 361/798 |
| 5,618,197 A | * | 4/1997 | Boadahl-Johnsen | 439/260 |
| 5,713,896 A | * | 2/1998 | Nardella | 606/50 |
| 6,166,903 A | * | 12/2000 | Ranchi et al. | 361/690 |

FOREIGN PATENT DOCUMENTS

JP      10-56106    *   2/1998  ................. 361/368

* cited by examiner

*Primary Examiner*—Neil Abrams
*Assistant Examiner*—J. F. Duverne
(74) *Attorney, Agent, or Firm*—Jeff D. Limon; Kevin D. Wills

(57) ABSTRACT

A power-coupling pad (FIG. 1, 160 or 170) is located on a lateral edge portion of an electronics module (100). Each power-coupling pad (160, 170) is mated with a power supply clip (FIG. 2, 240, 250) which is included within a side of a card guide that supports and retains the electronics module (100). The power supply clip (240, 250) can incorporate a spring which provides constant and affirmative contact with the power-coupling pad (160, 170) through a low resistance path. The power-coupling pad (160, 170) and power supply clip (240, 250) can be constructed using any suitable conductive material such as gold, nickel, lead, chromium and palladium.

16 Claims, 2 Drawing Sheets

APPARATUS FOR COUPLING POWER TO AN ELECTRONICS MODULE

FIELD OF THE INVENTION

The invention relates generally to the field of electronics and, more particularly, to supplying power to electronics equipment.

BACKGROUND OF THE INVENTION

In a computerized electronic system, which includes multiple electronics modules, a backplane is used in order to provide primary power to the modules, as well as to enable each of the modules to communicate with each other and with the external environment. As backplane communications technology progresses, fewer physical connections to the backplane are required since multiconductor parallel interfaces can be replaced by high-speed interfaces. Additionally, the use of high-speed fiber interconnections further reduces the required complexity of the backplane since each of the electronics modules can communicate with each other and with the external environment using only a single fiber-optic interface.

However, although electronics modules need only communicate using a single fiber optic connection, thus virtually eliminating the need for a conventional backplane, a need still exists to provide primary power to the electronics module. Hence, an apparatus for coupling power to an electronics module, which does not require a conventional backplane, would be highly desirable.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference numbers refer to similar items throughout the figures, and:

DESCRIPTION OF THE PREFERRED EMBODIMENTS

An apparatus for coupling power to an electronics module eliminates the need to use the backplane to bring primary power to the electronics module. According to one aspect of the invention, power is instead coupled through the lateral edge portion of the electronics module through the use of power-coupling pads located on the electronics module and power supply clips located within the channel of the card guide. By using the lateral edge portion of the electronics module, the length of any board traces on the electronics module can be reduced, thus reducing the level of electromagnetic interference caused by long lead lengths of current-carrying conductors. Additionally, through the use of substantially planar coupling pads located on the module and the power supply clip located in the card guide, a less resistive primary power-coupling path can be achieved.

Figure 1:
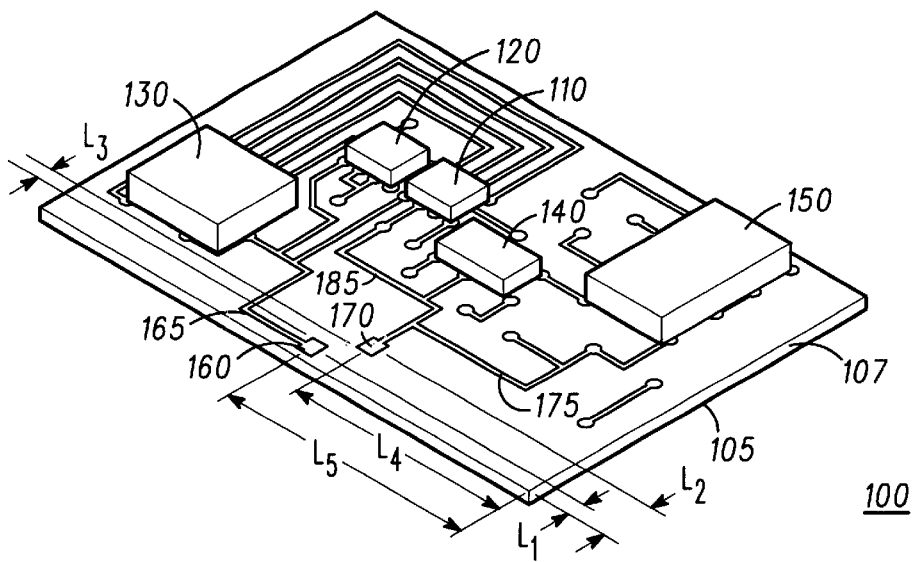
FIG. 1 is a block diagram of an electronics module, which includes provisions for receiving primary power in accordance with a preferred embodiment of the invention.

FIG. 1 is a block diagram of an electronics module which includes provisions for receiving primary power in accordance with a preferred embodiment of the invention. In FIG. 1, electronics module 100 includes electronic components 110, 120, 130, 140, and 150. These electronic components can be and type of computer electronics components such as central processing units, memory elements, bus interfaces, and related equipment. Each of these electronic components receives primary power from at least one of power-coupling pads 160 and 170 using board traces 165, 175, and 185. Electronic components 110, 120, 130, 140, and 150 may communicate with each other using board traces other than those shown. This additional coupling paths can include address lines, control lines, data buses and hardware interrupts. Data connectors, such as those used for fiber optic interfaces, have not been shown for simplicity.

As an example, which is not intended to limit the scope of the invention, power-coupling pad 160 can be intended to convey a primary power voltage of 5 Volts to each of electronic components 110, 120, and 130. Continuing with this example, power-coupling pad 170 may be intended to convey a voltage of 12 Volts to electronic components 140, 150, and 110, where electronic component 110 requires dual voltage inputs of 5 and 12 Volts.

Power-coupling pads 160 and 170 are preferably located at lateral edge portion 105 of electronics module 100 within an area, which contacts a card guide when the module is inserted. In the example of FIG. 1, power-coupling pad 160 is located a distance L1 from the lateral edge portion of electronics module 100 and a distance of L4 from front edge 107 of the electronics module. Further in accordance with the example of FIG. 1, power-coupling pad 170 is located a distance L2 from the lateral edge portion of electronics module 100, and a distance L5 from front edge 107 of the electronics module. Additionally, power-coupling pads 160 and 170 are separated by a lateral distance of L3.

It should be noted that the use of power-coupling pads 160 and 170 has on a lateral edge portion of electronics module 100 allows a greater degree of freedom in the placement of electronic components 110, 120, 130, 140, and 150. In the event that one or more of these electronics components requires a large current to operate the component, the particular component need not be placed near front edge 107 in order to reduce resistive losses. Rather, the high current component can be placed along the length of lateral edge portion 105, thereby allowing a reduction in the associated board trace, which conveys the power to the device, such as board traces 165, 175, and 185. This can be useful in reducing the amount of radiated electromagnetic interference caused by high current signals conveyed through long board traces.

Power-coupling pads 160 and 170 can be comprised of a metal such as gold, palladium, nickel, chromium, lead or other suitable metal, which possesses high conductivity, as well as a degree of resistance to corrosion. Additionally, it is desirable that the metal selected for use by power-coupling pad 160 and 170 be sufficiently durable so as not to be easily abraded as a result of repeated insertion and removal of electronics module 100 into and out of the card guide of FIG. 2. Further, power-coupling pads 160 and 170 are desirably separated by an amount equal to L3. This separation precludes the possibility of shorting together two power supply clips (as described in reference to FIG. 2) during insertion and removal of electronics module 100. The possibility of shorting two power supply clips together can be further reduced by placing coupling pads 160 and 170 on both the first and second sides of electronics module 100.

Figure 2:
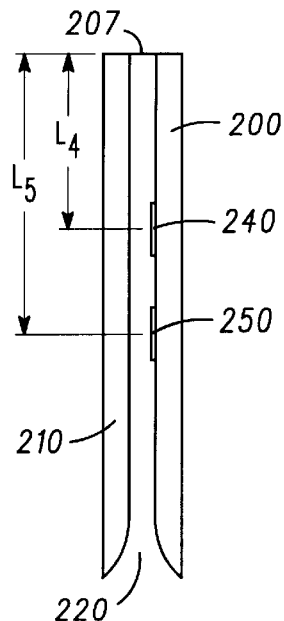
FIG. 2 is a top view of a card guide for coupling power to the electronics module of FIG. 1 in accordance with a preferred embodiment of the invention.

FIG. 2 is a top view of a card guide for coupling power to the electronics module of FIG. 1 (100) in accordance with a preferred embodiment of the invention. In FIG. 2, card entrance 220 is intended to receive a lateral edge portion of electronics module 100 as the electronics module is slid into the card guide of FIG. 2 towards front edge 207 portions. Preferably, the card guide of FIG. 2 operates mechanically in a manner similar to conventional card guides by retaining and supporting the electronics module as the module is wedged between first half 200 and second half 210. A second card guide which incorporates the conventional electronics module support and retention features of the card guide of FIG. 2 is preferably mechanically interfaced to the opposite lateral edge portion of electronics module 100 in order to support the electronics module from both the top and bottom.

When electronics module 100 is inserted into the card guide of FIG. 2, power-coupling pad 170 preferably makes contact with power supply clip 240. Similarly, power-coupling pad 160 makes contact with power supply clip 250. Power supply clips 240 and 250 are preferably located a distance L4 and L5, respectively, from front edge 207 portion of the card guide of FIG. 2. Additionally, although not shown in the two-dimensional view of FIG. 2, power supply clip 240 is offset a distance L2 from the deepest portion of the channel of the card guide of FIG. 2 in order to mate with power-coupling pad 170. In a similar manner, power supply clip 250 is offset a distance L1 from the deepest portion of the card guide in order to mate with power-coupling pad 160.

Figure 3:
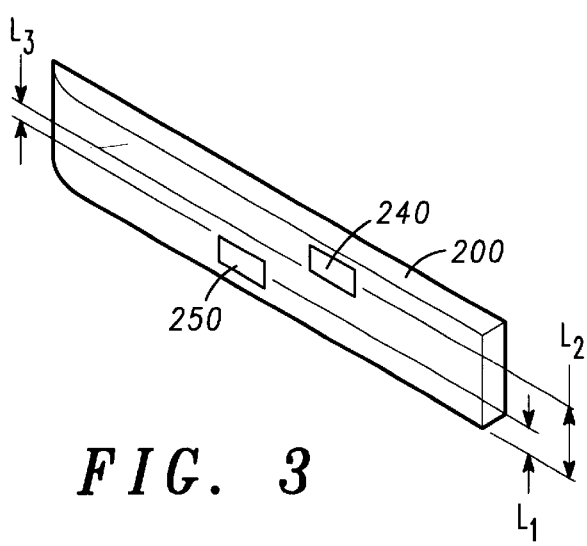
FIG. 3 is an isometric view of a portion of the card guide of FIG. 2 which includes provisions for coupling power to an electronics module in accordance with a preferred embodiment of the invention.

FIG. 3 is an isometric view of a portion of the card guide of FIG. 2 which includes provisions for coupling power to an electronics module in accordance with a preferred embodiment of the invention. In FIG. 3, the arrangement of power supply clips 240 and 250 within the card guide of FIG. 2 can be more easily seen. As previously mentioned in reference to FIG. 2, power supply clip 240 is offset by an amount of L2 from the deepest portion of the card guide. In a similar manner, power supply clip 250 is offset from the deepest portion of the card guide by an amount of L1. In order to maintain continuous and positive contact with power-coupling pads 170 and 160 of electronics module 100, first half 200 of the card guide of FIG. 2 preferably includes a spring or other resilient element which possesses the capability recover its shape after deformation. Additionally, although shown as rectangular in nature, power supply clips 240 and 250 as well as power coupling pads 160 and 170 need not be in accordance with this shape. According to the needs of the particular application, the power supply clips and power-coupling pads may assume various other shapes such as circles, ellipses, or other suitable geometries.

Although FIGS. 1–3 indicate the use of power-coupling pads and power supply clips located only on a first side of an electronics module and on a corresponding first half of a card guide, nothing prevents the use of power coupling pads on the reverse side of electronics module 100. In a similar manner, nothing precludes the use of a power supply clip located on the opposite side of the card guide of FIG. 2.

Figure 4:
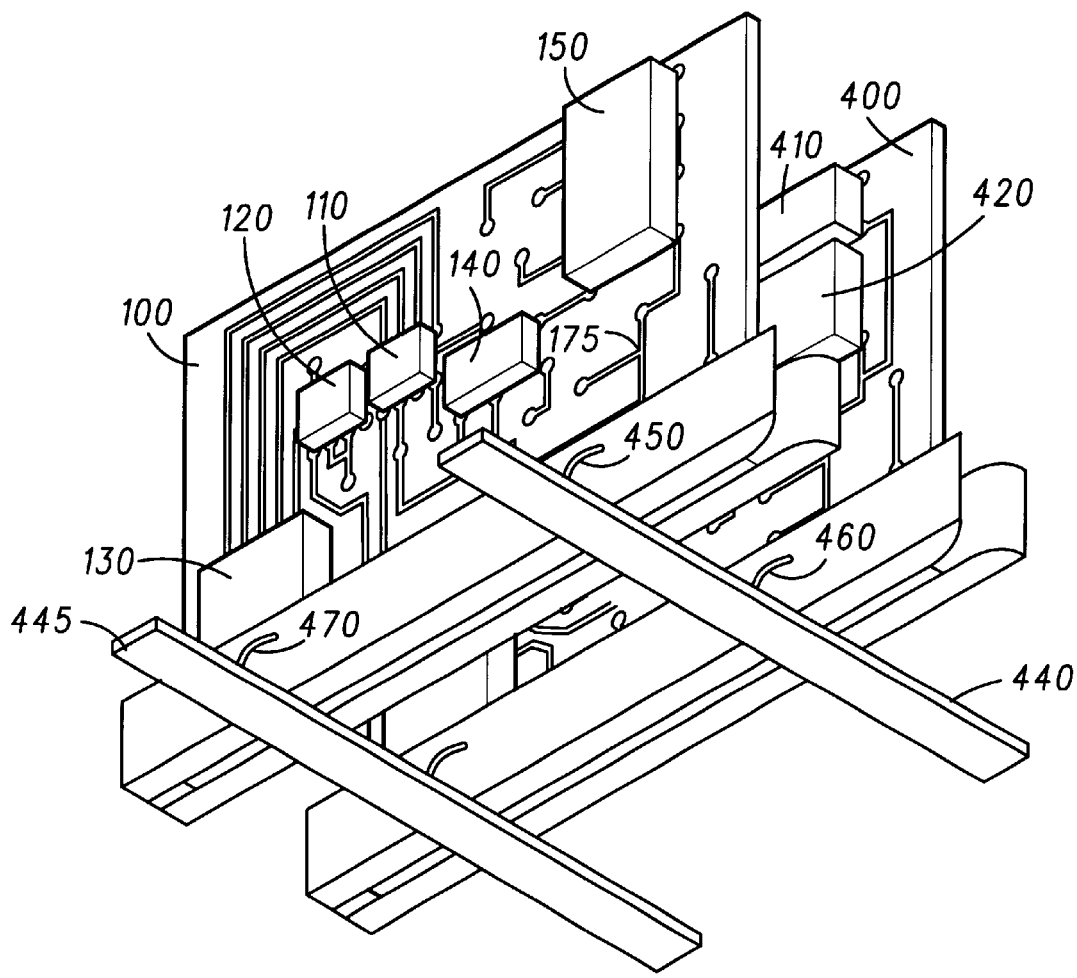
FIG. 4 is an isometric view of an apparatus for coupling power to multiple electronics modules in accordance with a preferred embodiment of the invention.

FIG. 4 is an isometric view of an apparatus for coupling power to multiple electronics modules in accordance with a preferred embodiment of the invention. In FIG. 4, primary power bus 440 conveys power to electronics modules 100 and 400 by way of primary power-coupling lines 450 and 460, respectively. In a similar manner, primary power bus 445 conveys power to electronics modules 100 by way of primary power-coupling line 470. The use of separate primary power buses in FIG. 4 allows distinct voltages to be conveyed to each of electronics modules 100 and 400. Thus, primary power bus 440 can convey 12 volts to electronics modules 100 and 400, while primary power bus 445 conveys 5 V primary power to the electronics module 100. Although the technique of power-coupling is shown as requiring wire loops, the present invention does not require this. Other conventional techniques of coupling power to the electronics modules may be used.

An apparatus for coupling power to an electronics module eliminates the need to use the backplane to bring primary power to the electronics module. The resulting system provides additional freedom by allowing board designers to locate high current and electromagnetic field-generating components near power-coupling pads, thus reducing resistive losses and electromagnetic fields caused by longer board traces. Additionally, through the use of substantially planar coupling pads located on the module and the power supply clip located in the card guide, a less resistive primary power coupling path can be achieved.

Accordingly, it is intended by the appended claims to cover all modifications of the invention that fall within the true scope and spirit of the invention.

What is claimed is:

1. An apparatus for coupling power to an electronics module, comprising:
   a power-coupling pad located on said electronics module within an area which contacts a card guide, said card guide being used to retain said electronics module during operation of said electronics module,
   a power supply clip included within said card guide for contacting said power-coupling pad when said electronics module is retained, and
   a primary power bus coupled to said lower supply clip, said primary lower bus conveying power to said power supply clip.

2. The apparatus of claim 1, wherein said power-coupling pad is located a particular distance from a lateral edge portion of said electronics module.

3. The apparatus of claim 2, wherein said power supply clip is located within said card guide about at said particular distance from a deepest portion of said card guide.

4. The apparatus of claim 1, wherein a second power-coupling pad is located a second particular distance from a lateral edge portion of said electronics module, and wherein a second power supply clip is located at said second particular distance within said card guide.

5. The apparatus of claim 4, wherein said second power-coupling pad receives a voltage which is different than a voltage received by said first power-coupling pad.

6. The apparatus of claim 1, wherein said power supply clip incorporates a substantially flat surface, which makes intimate contact with said power-coupling pad.

7. A system for conveying primary power to an electronic component, comprising:
   an electronics module to which said electronic component is mounted; and
   a power-coupling pad located on a side of said electronics module, said power-coupling pad being located within an area which contacts a card guide when said electronics module is inserted into an enclosure, said power-coupling pad being located a particular distance from a lateral edge portion of said electronics module.

8. The system of claim 7, wherein said power-coupling includes a significant portion of a metal selected from a group consisting of gold, palladium, nickel, lead, and chromium.

9. The system of claim 7, additionally comprising a second power-coupling pad located a second particular distance from said lateral edge portion of said electronics module.

10. The system of claim 9, wherein said first and second power-coupling pads convey distinct voltages to said electronics module.

11. The system of claim 7, additionally comprising a second power-coupling pad located on a second side of electronics module.

12. The system of claim 11, wherein said first and second power-coupling pads convey distinct voltages to said electronics module.

13. A system for conveying primary power to an electronic component, comprising:

an electronics module to which said electronic component is mounted;

a first power-coupling pad located on a side of said electronics module, said first power-coupling pad being located within an area which contacts a card guide when said electronics module is inserted into an enclosure, said first power-coupling pad being located at a first particular distance from a lateral edge portion of said electronics module; and a second power-coupling pad located on a side of said electronics module, said second power-coupling pad being located within an area which contacts a card guide when said electronics module is inserted into an enclosure, said second power-coupling pad being located at a second particular distance from a lateral edge portion of said electronics module.

14. The system of claim 13, wherein said first and second power-coupling pads are comprised of a metal selected from the group consisting of gold, palladium, nickel, chromium, lead and chromium.

15. The system of claim 13, wherein said second power-coupling pad is intended for use as a ground by said electronics module.

16. The system of claim 13, wherein said first power-coupling pad is substantially planar.

* * * * *